(12) United States Patent
Parsche (10) Patent No.: US 8,427,378 B2
(45) Date of Patent: Apr. 23, 2013

(54) ELECTRONIC DEVICE HAVING SOLAR CELL ANTENNA ELEMENT AND RELATED METHODS

(75) Inventor: Francis Eugene Parsche, Palm Bay, FL (US)

(73) Assignee: Harris Corporation, Melbourne, FL (US)

( * ) Notice: Subject to any disclaimer, the term of this patent is extended or adjusted under 35 U.S.C. 154(b) by 374 days.

(21) Appl. No.: 12/844,035

(22) Filed: Jul. 27, 2010

(65) Prior Publication Data

US 2012/0026067 A1 Feb. 2, 2012

(51) Int. Cl.
*H01Q 1/24* (2006.01)

(52) U.S. Cl.
USPC ............... 343/702; 343/700 MS; 343/904; 136/291

(58) Field of Classification Search ......... 343/702, 343/700 MS, 904; 136/291, 24, 258, 261, 136/262; 250/347
See application file for complete search history.

(56) References Cited

U.S. PATENT DOCUMENTS

| | | | |
|---|---|---|---|
| 4,864,317 A | 9/1989 | Sorko-Ram | 343/720 |
| 4,879,570 A | 11/1989 | Takizawa et al. | 343/713 |
| 5,161,255 A | 11/1992 | Tsuchiya | 455/345 |
| 5,752,676 A | 5/1998 | Shapira et al. | 244/173 |
| 5,760,706 A | 6/1998 | Kiss | 340/825.69 |
| 5,986,618 A | 11/1999 | Aakula et al. | 343/872 |
| 6,087,991 A | 7/2000 | Kustas | 343/700 MS |
| 6,191,746 B1 | 2/2001 | Nagy | 343/713 |
| 6,317,090 B1 | 11/2001 | Nagy et al. | 343/713 |
| 6,394,395 B1 | 5/2002 | Poturalski et al. | 244/173 |
| 6,522,301 B2 | 2/2003 | Takayama et al. | 343/709 |
| 6,590,150 B1 * | 7/2003 | Kiefer | 136/258 |
| 6,894,659 B2 | 5/2005 | Pepperling et al. | 343/878 |
| 6,952,530 B2 | 10/2005 | Helvajian et al. | 398/128 |
| 7,129,493 B2 * | 10/2006 | Garner et al. | 250/347 |
| 2008/0055177 A1 | 3/2008 | Dixon | 343/787 |
| 2011/0130179 A1 * | 6/2011 | Luan | 455/575.7 |

FOREIGN PATENT DOCUMENTS

DE 19938199 1/2001

OTHER PUBLICATIONS

Henze et al., "Photovoltaic Power Supply and Antennas in One Device for Wireless Telecommunication Equipment", IEEE, Sep. 2005, pp. 71-76.
Henze et al., "Investigation of Planar Antennas With Photovoltaic Solar Cells for Mobile Communications", IEEE, vol. 1, Sep. 2004, pp. 622-626.
IXOLAR™ High Efficiency SolarBIT, Technical Information XOB17, IXYS Semiconductor GmbH, Jun. 2009, pp. 1-4.

* cited by examiner

*Primary Examiner* — Hoang V Nguyen
(74) *Attorney, Agent, or Firm* — Allen, Dyer, Doppelt, Milbrath & Gilchrist, P.A.

(57) ABSTRACT

An antenna may include a ground plane and a solar cell spaced above the ground plane. The solar cell may have first and second power output terminals. The antenna may include a coaxial antenna feed line including an inner conductor coupled to the first power output terminal, and an outer conductor coupled to the ground plane so that the solar cell also serves as a patch antenna element. The antenna may further include a drive shunt conductor extending between the first terminal and the ground plane.

20 Claims, 10 Drawing Sheets

FREQUENCY
5 MHz - 3 GHz

ELECTRONIC DEVICE HAVING SOLAR CELL ANTENNA ELEMENT AND RELATED METHODS

FIELD OF THE INVENTION

The present invention relates to the field of electronic devices, and, more particularly, to electronic devices including solar cell antennas and related methods.

BACKGROUND OF THE INVENTION

A patch antenna is a common type of antenna and typically includes a single metal patch suspended over a ground plane. A patch antenna may have a length of approximately one-half wavelength of a desired frequency, for example. A patch antenna may be constructed on a dielectric substrate, and may include lithographic patterning used to fabricate printed circuit boards. A patch antenna typically requires an electrical tap into the patch body. This may be difficult to implement on a solar cell.

Antennas are realized by the motion of electric currents on conductive shapes. Euclidian geometries may be preferred antenna shapes as they are known for increased performance. Canonical antenna types include the dipole and the loop, which use divergence and curl motions. The Euclidian forms of the dipole and loop antennas are typically lines and circles of wire.

Although some antennas are wire, flat two-dimensional (2D), or planar antennas may be valuable for their relatively low cost, ease of manufacture, and utility. A planar antenna generally requires metal layers for unidirectional radiation broadside from the antenna plane. The microstrip patch antenna is an example of a flat antenna that includes a conductive layer and "patch" antenna element. The conductive plane generally includes a connection to the transmission line or to the patch antenna element. This connection may cause a microstrip transverse electromagnetic mode (TEM) transmission line in situ, which refers to the antenna radiation resistance, to a useful value, for example, 50 Ohms. Thus, the microstrip patch antenna elements are able to operate with increased efficiency relatively close to the metal plane. The metal reflector is often termed a "ground plane" due to the conductive electrical connection thereto.

A microstrip patch antenna is generally known for its relatively narrow bandwidth, relatively high gain for area, and relatively thin size. The microstrip patch antenna have become almost ubiquitous for many applications including Global Positioning System (GPS) receivers, personal communications, and for satellites in space.

A solar cell is a planar device that converts energy from light, and more particularly, sunlight, into electricity. A solar cell is generally silicon and weighs 5803 pounds per cubic meter. A typical solar cell is about 0.002 meters thick making a typical solar panel weigh at least 15 pounds per square meter.

The weight of a solar cell may be particularly important for determining a cost to launch a satellite, for example. In the year 2000, for example, launch costs were $11,729 per pound. $11,729 per pound times 15 pounds per square meter results in an estimated launch cost of a solar panel to be at least $176,000 per square meter.

A patch antenna may use a Teflon™ substrate, which weighs about 4840 pounds per cubic meter and patch antennas may be about the same thickness as a solar cell. The Teflon™ patch antenna weighs, for example, about 83% of the silicon solar panel. (4840/5803=0.83 or 83%). Savings from combining solar cells and antennas, in other words, not having to launch a redundant cubic meter of a patch antenna, is $146,800. ($176,000 per square meter times 0.83 Teflon™/silicon weights=$146,800). Thus, a combined solar cell and patch antenna may equate to a savings of $146,000 per square meter of satellite solar cell surface due to launch costs and weight reduction.

U.S. Pat. No. 6,590,150 to Kiefer discloses a combination photovoltaic cell and RF antenna. More particularly, Kiefer discloses the photovoltaic cell and RF antenna being formed of a semiconductor material laminated to a dielectric backing. The dielectric backing is bonded to a metallic substrate to provide a ground plane. The photovoltaic cell is electrically connected by wire leads with the power circuit of a transceiver or load to supply electrical power thereto in a manner of a conventional solar cell.

U.S. Patent Application Publication No. 2008/0055177 to Dixon discloses a combined solar panel and antenna formed as a patch antenna. The patch antenna includes an active element formed from a portion of a solar cell spaced from a ground plane. A spring arm including a conductive plate is capacitively coupled to a coaxial cable and supports the solar cell. Extraction of DC power from the solar cell patch antenna is not described.

SUMMARY OF THE INVENTION

In view of the foregoing background, it is therefore an object of the present invention to provide an electronic device that includes a solar cell that also functions as a patch antenna.

This and other objects, features, and advantages in accordance with the present invention are provided by an electronic device that includes a ground plane and a solar cell spaced above the ground plane. The solar cell has first and second power output terminals. The electronic device further includes a coaxial antenna feed line including an inner conductor coupled to the first power output terminal, and an outer conductor coupled to the ground plane so that the solar cell also serves as a patch antenna element. The electronic device further includes a drive shunt conductor extending between the first terminal and the ground plane, for example. Accordingly, the solar cell advantageously converts light to electric power and operates as a patch antenna.

The electronic device may further include at least one antenna tuning body between the ground plane and the solar cell. The at least one antenna tuning body may include a dielectric material. The at least one antenna tuning body may include a plurality of antenna tuning bodies, for example.

The drive shunt conductor may be coupled to the ground plane adjacent the coaxial antenna feed line. The electronic device may include an electrical power conductor coupled to the second power terminal. The ground plane may have an opening therein adjacent the electrical power conductor. The electrical power conductor may pass through the opening. The solar cell may be spaced above the ground plane by less than 0.1 times a wavelength of a desired operating frequency of the patch antenna element, for example.

A method aspect is directed to a method of making an antenna. The method includes spacing a solar cell above a ground plane. The solar cell has first and second power output terminals. The method also includes coupling an inner conductor of a coaxial antenna feed line to the first power output terminal, and coupling an outer conductor of the coaxial antenna feed line to the ground plane so that the solar cell also serves as a patch antenna element, for example. The method

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar elements in alternative embodiments.

Referring initially to FIGS. 1-4, an electronic device 10 illustratively includes a housing 31. The electronic device also includes circuitry 34 carried by the housing 31. The circuitry 34 includes input devices 33 and a display 32. The circuitry 34 also includes a receiver and/or transmitter 37.

Figure 1:
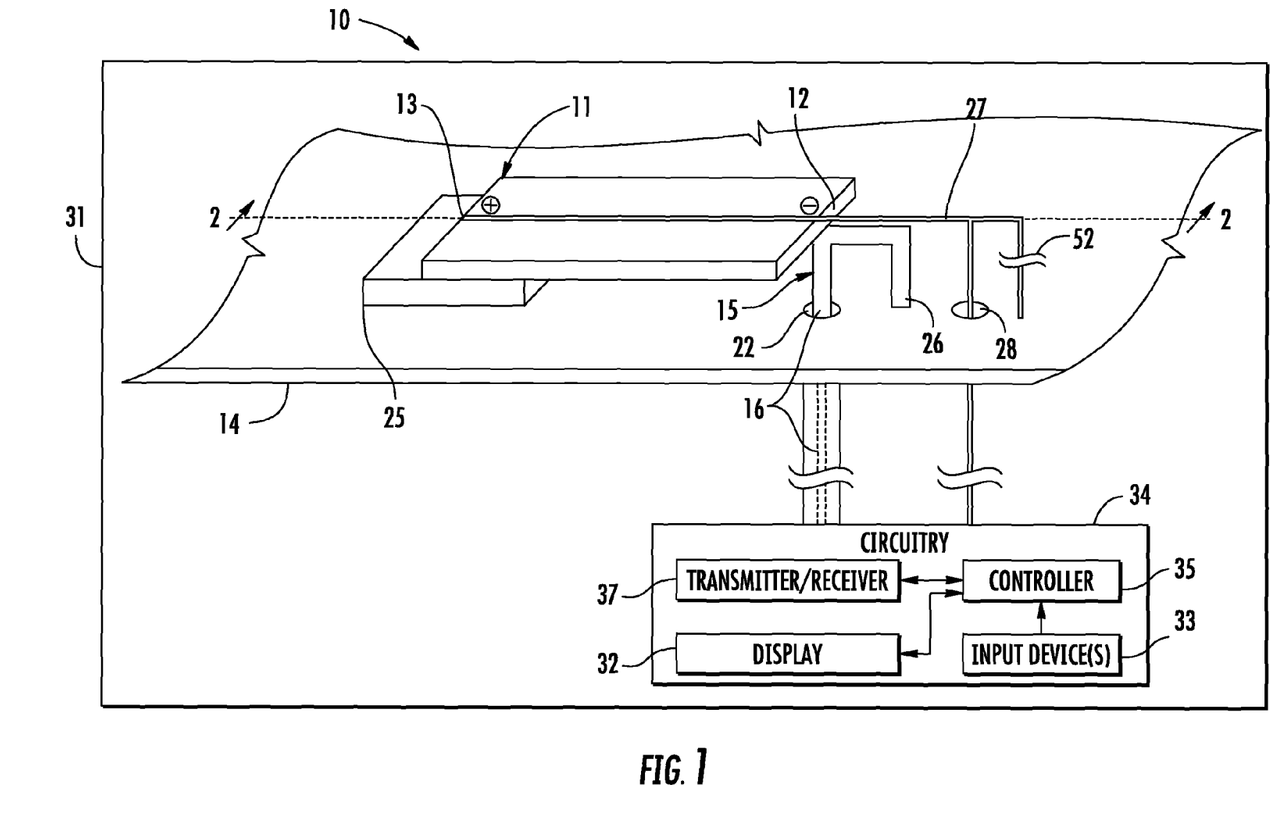
FIG. 1 is a perspective view of a portion of an electronic device in accordance with the present invention.
Figure 2:
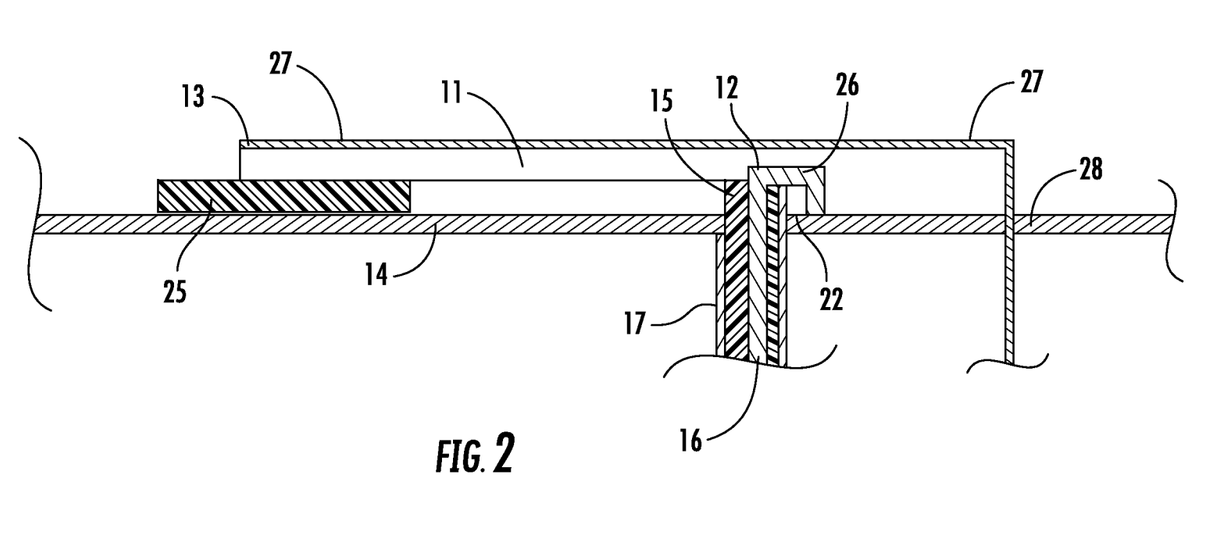
FIG. 2 is a cross-sectional view of the portion in FIG. 1 taken along the line 2-2.
Figure 3:
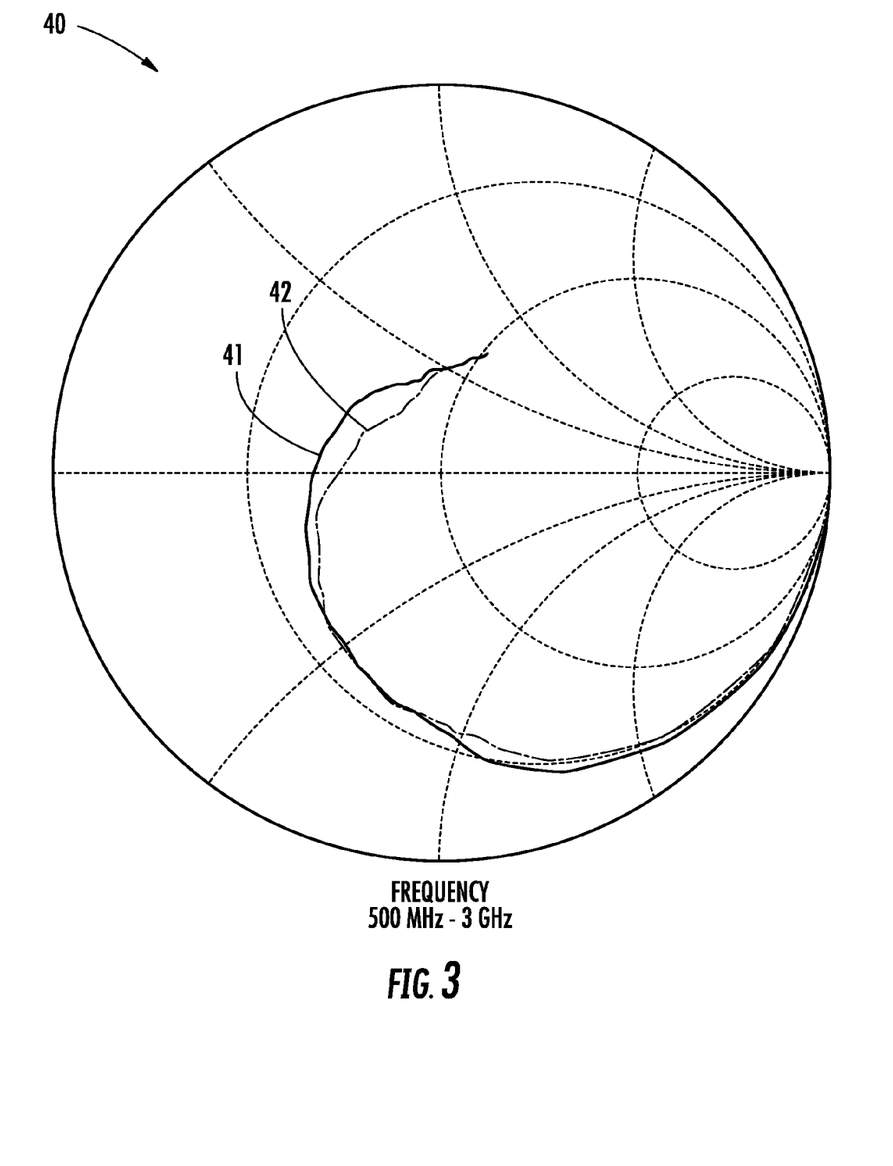
FIG. 3 is a graph of measured impedance of a solar cell.
Figure 4:
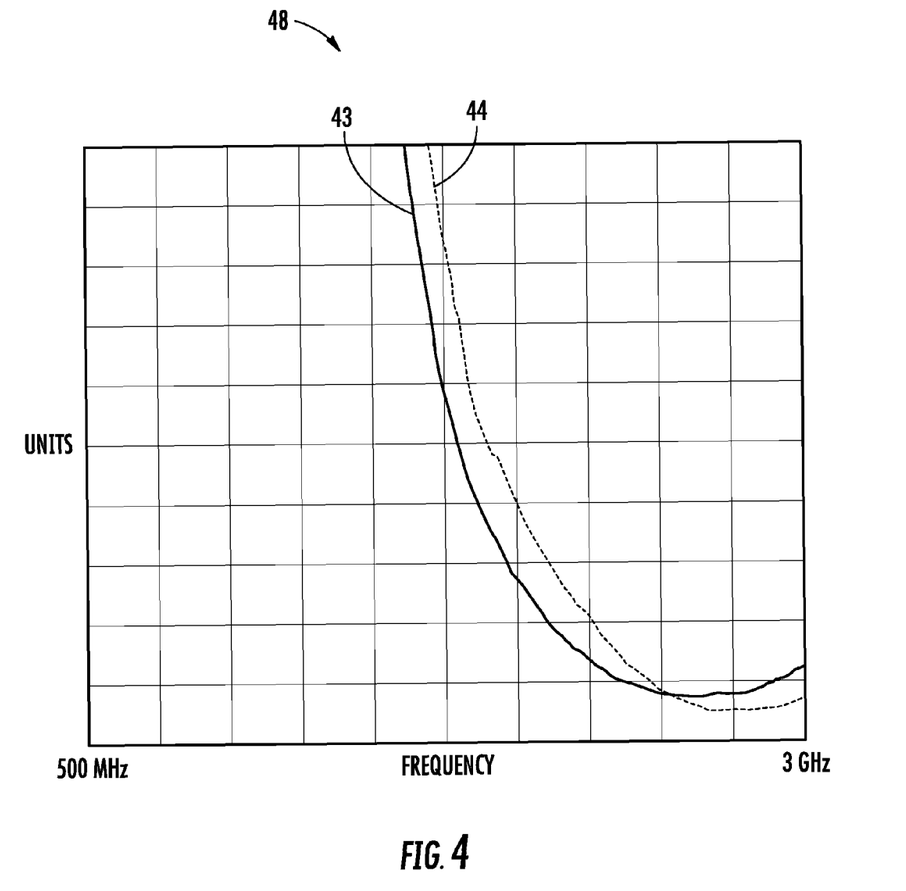
FIG. 4 is a graph of measured VSWR of the solar cell measured in FIG. 3.

The circuitry 34 includes a controller 35 that is coupled to the display 32 and input devices 33, and is carried by the housing 31. The controller 35 may perform at least one wireless communications function. For example, the electronic device 10 may be a cellular telephone, and the controller 35 may cooperate with the receiver and/or transmitter 37 to communicate with a cellular base station. Of course, the electronic device 10 may be another type of device, for example, a two-way radio or a satellite receiver. The controller 35 may cooperate with the receiver and/or transmitter 37 to perform either or both of a receive and transmit function.

The electronic device 10 illustratively includes a solar cell 11. The solar cell 11 may be an XOB 17-12 X1 solar cell available from IXYS Corporation of Milpitas, Calif. The solar cell 11 includes opposing first and second power terminals 12, 13 corresponding to positive and negative power terminals. In some embodiments (not shown) the first and second power terminals 12, 13 may be adjacent. Other models and/or types of solar cells may be used.

The solar cell 11 is illustratively spaced above the ground plane 14. The ground plane 14 may be a metal sheet ground plane, for example, copper. The ground plane 14 may be another type of material, such as a printed wiring board (PWB) as will be appreciated by those skilled in the art.

A coaxial antenna feed line 15 supports the solar cell 11 at one end adjacent the first power output terminal 12. The coaxial antenna feed line 15 illustratively includes an inner conductor 16 coupled to the first power output terminal 12. The first power terminal 12 is illustratively a negative power terminal. Alternatively, the first power terminal 12 may be a positive terminal. The coaxial antenna feed line 15 also includes an outer conductor 17 coupled to the ground plane 14 so that the solar cell 11 also serves as a patch antenna element.

The solar cell 11 is particularly useful as a patch antenna element because it has a relatively high electrical conductance. For example, as illustrated in the graph 40 of FIG. 3, the solar cell 11 may have a radio frequency driving resistance 41 that is about 96% of that of a brass strip driving resistance 42 having nearly the same dimensions of the solar cell. Moreover, as illustrated in the graph 48 of FIG. 4, the solar cell 11 has a voltage standing wave ratio (VSWR) frequency response 43 that was about 8% lower than the brass strip frequency response 44. The brass strip driving resistance 42 and the brass strip frequency response 43 of FIGS. 3 and 4 were measured after swapping the solar cell with an identical size brass strip. Both the brass strip and solar cell were stood on end and operated as quarter-wave monopoles over a relatively electrically large ground plane.

Still further, as will be appreciated by those skilled in the art, passive intermodulation (PIM) is reduced in a solar cell. The reduced PIM is a result of the relatively high conductivity of the solar cell. Indeed, a relatively low PIM is particularly advantageous for satellite applications. Solar cells may increasingly be made with transparent thin film conductive layers, such as metal oxides, for example.

Additionally, an increase in the height of the solar cell 11 above the ground plane 14 may correspond to an increase in the bandwidth of the antenna. For example, the height of the solar cell 11 above the ground plane 14 may be $0.01\lambda$, where $\lambda$ is the wavelength at a desired frequency. Additionally, if the height of the solar cell 11 is greater than $0.1\lambda$, then the solar cell may not act as a patch antenna element.

The ground plane 14 illustratively has an opening 22 therein adjacent the first power terminal 12. The coaxial antenna feed line 15 extends through the opening 22 and may couple to the circuitry 34, and more particularly to the receiver and/or transmitter 37.

As will be appreciated by those skilled in the art, the solar cell 11 may come in a standard size. The standard size, for example, the size of an uncut commercial off the shelf (COTS) solar cell, may not be sized to a desired operating frequency. Accordingly, a tuning body 25 is used to change the natural frequency or natural resonance of the solar cell 11. The tuning body 25 allows any shape or size solar cell 11 to be used.

The tuning body 25 is positioned between the solar cell 11 and ground plane 14 adjacent the second power terminal 13 of the solar cell. The tuning body illustratively extends beyond the end of the solar cell 11 adjacent the second power terminal 13. The tuning body 25 is set along an axis that extends the length of the solar cell for tuning the antenna. In other words, the operating frequency is determined based upon the position of the tuning body 25 relative to the end of the solar cell 11. Moving the tuning body 25 inward, that is further under the solar cell 11, reduces the operating frequency, while moving the tuning body further out from the solar cell increases the operating frequency.

More particularly, the tuning body 25 provides a reduced electrical driving function and cooperates with the ground plane 14 to act as a capacitor, since the bottom of the solar cell 11 corresponds to one plate of the capacitor, and the ground plane 14 corresponds to the other plate. The natural resonance of the solar cell 11 is thus replaced with a forced resonance provided by the cooperation of the tuning body 25.

The tuning body 25 is a dielectric tuning body and is illustratively rectangular in shape. The tuning body 25 may have a width corresponding to the solar cell 11. However, the tuning body 25 may be any size and/or shape. Additionally, the tuning body 25 may be a Teflon™, polyethelyne, wax, paraffin, and/or ferrite, or a combination of dielectric materials. The tuning body 25 may be formed of other materials, as will be appreciated by those skilled in the art.

A metal drive shunt conductor 26 illustratively extends between the first terminal 12 and the ground plane 14. The drive shunt conductor 26 is illustratively L-shaped, but may be another shape, for example a straight line or serpentine, and may be another material. For example, the drive shunt conductor 26 may be a freestanding metal wire or a conductive trace on a printed circuit board (PCB) material.

The drive shunt conductor 26 couples the first terminal 12 and center conductor 16 to the ground plane 14 at a predetermined distance from the coaxial antenna feed line 15. As will be appreciated by those skilled in the art, the drive shunt conductor 26 may be desirable because coupling the center conductor 16 to only the first terminal 12 may not be sufficient to drive a desired radio frequency (RF) signal. The drive shunt conductor 26 advantageously produces relatively low resistance to increase reactance.

The distance between the drive shunt conductor 26 and the coaxial antenna feed line 15 sets the impedance of the antenna. For example, the distance may be set to provide an impedance of 50 Ohms. As will be appreciated by those skilled in the art, the distance between the drive shunt conductor 26 and the coaxial feed line 15 may also be dependent on the height of the solar cell 11 above the ground plane 14.

The drive shunt conductors 26 can be used to form solar cell antennas from solar cells of many shapes and sizes. Solar cells having a circular or square circumference of about 1 wavelength typically radiate broadside or upwards from the ground plane, and solar cells less than a half wavelength may typically radiate more in the plane of the ground plane 14.

A bypass capacitor 52 may be coupled between the drive shunt conductor 26 and the ground plane 14 adjacent the coupling location of the drive shunt conductor and the ground plane. The bypass capacitor 52 conveys any RF currents on the drive shunt conductor 26 to the ground plane 14.

An electrical power conductor 27 is illustratively coupled to the second power terminal 13. The electrical power conductor 27 may be, for example, an insulated wire or a PWB trace. The electrical power conductor 27 carries the direct current (DC) power generated from the solar cell 11. The electrical power conductor 27 is illustratively folded and positioned across the top of the solar cell 11. This geometry for the electrical power conductor 27 advantageously provides an isolating effect so that the withdrawal of DC power from the solar cell has a reduced effect on the RF operation of the antenna. The electrical power conductor 27 passes through an opening 28 in the ground plane 14 and is coupled to the circuitry 34. The electrical power conductor 27 passes through the opening 28 adjacent the location where the drive shunt conductor 26 couples to the ground plane 14 and adjacent the coaxial antenna feed line 15.

The collective area where the electrical power conductor 27 passes through an opening 28, where the drive shunt conductor 26 couples to the ground plane 14, and adjacent the coaxial antenna feed line 15, is called the virtual ground area. The virtual ground area is the area of the ground plane 14 that provides a reduced amount of interference with the solar cell 11 acting as a patch antenna. The electrical power conductor 27 may pass through the opening 28 in another location, for example. Still further, the folded electrical power conductor 27 may cooperate with the solar call 11 to provide improved instantaneous bandwidth via a double tuned Chebyschev polynomial frequency response from the solar cell antenna.

Figure 5:
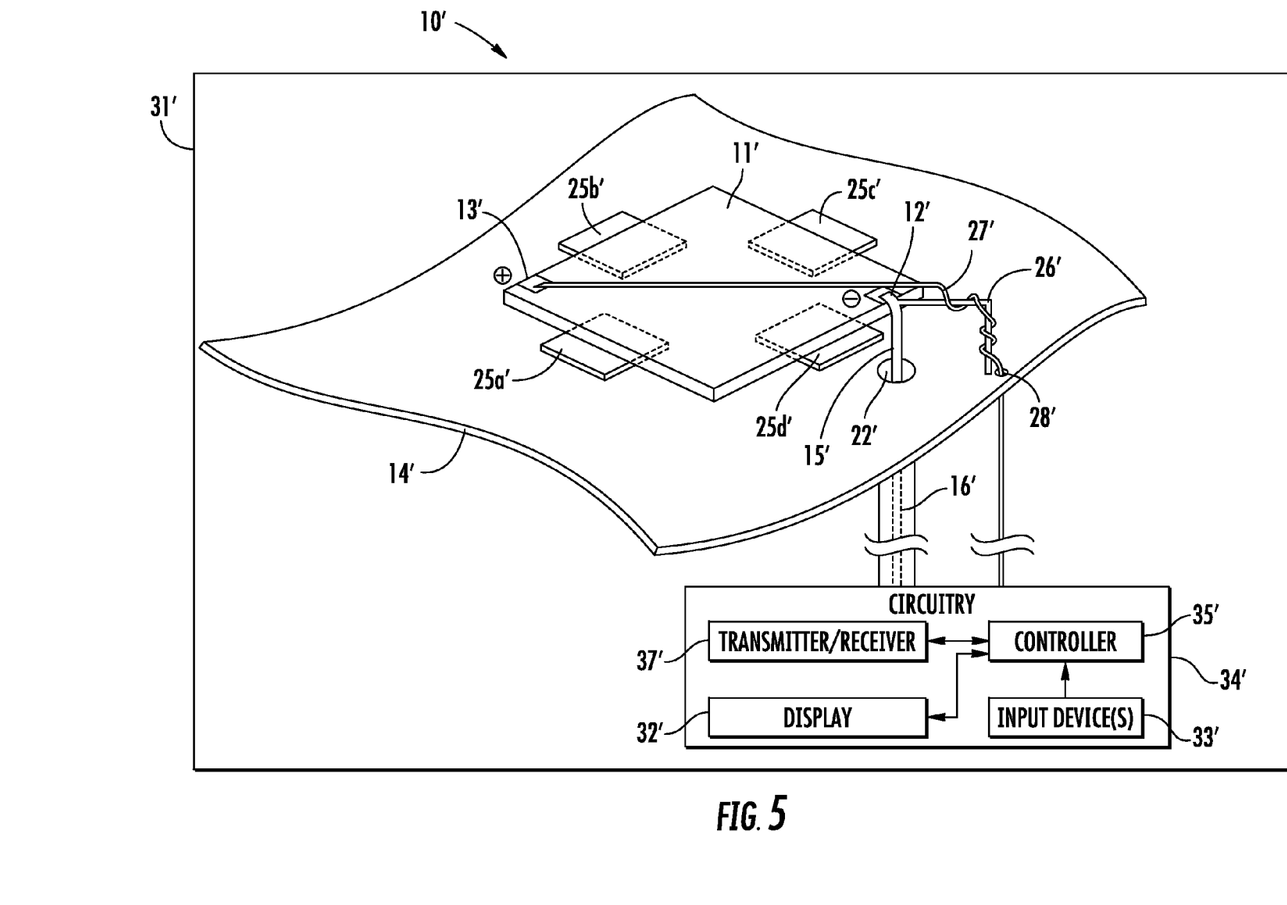
FIG. 5 is a perspective view of another embodiment of a portion of an electronic device according to the present invention.

Referring now to FIG. 5, another embodiment of a portion of an electronic device 10' is illustrated. The solar cell 11' is illustratively square in shape, and also serves as a patch antenna providing either linear or circular polarization by adjustment of tuning or solar cell dimensions. The circular polarization may be particularly advantageous in global positioning system (GPS) applications. The solar cell 11' includes first and second power terminals 12', 13' in opposing corners of the square shaped solar cell 11' corresponding to positive and negative power terminals.

The coaxial antenna feed line 15' does not support the solar cell 11', but is adjacent the first power output terminal 13'. Instead, four dielectric tuning bodies 25a'-25d' are positioned underneath and extending from a center of each side of the solar cell 11'. The tuning bodies 25a'-25d' may be other sizes and shapes and may be positioned differently to support the solar cell 11'. Also, a different number of tuning bodies may be used.

The tuning bodies 25a'-25d' are adjusted to detune each edge or side of the solar cell 11' relative to the other edges. This advantageously advances or retards phasing of radiation from each edge making a radio wave rotate. The edges may range from $0.2\lambda$ to $0.4\lambda$ in physical length at the desired operating frequency. Radiation relative to the solar cell 11' is broadside. In other words, there is a beam normal to the patch antenna plane (the solar cell 11' plane).

The metal drive shunt conductor 26' extends diagonally from the corner between the first power terminal 12' and the ground plane 14'. The electrical power conductor 27' is illustratively coupled to the second power terminal 13' and extends diagonally across the solar cell 11' to the metal drive shunt conductor 20'. The electrical power conductor 27' spirally wraps around the metal drive shunt conductor 26' as it extends from the solar cell 11' and downward to the ground plane 14'. The electrical power conductor 27' passes through the opening 28' in the ground plane 14'. The opening 28' is directly adjacent the coupling location of the metal drive shunt 26'.

Figure 6:
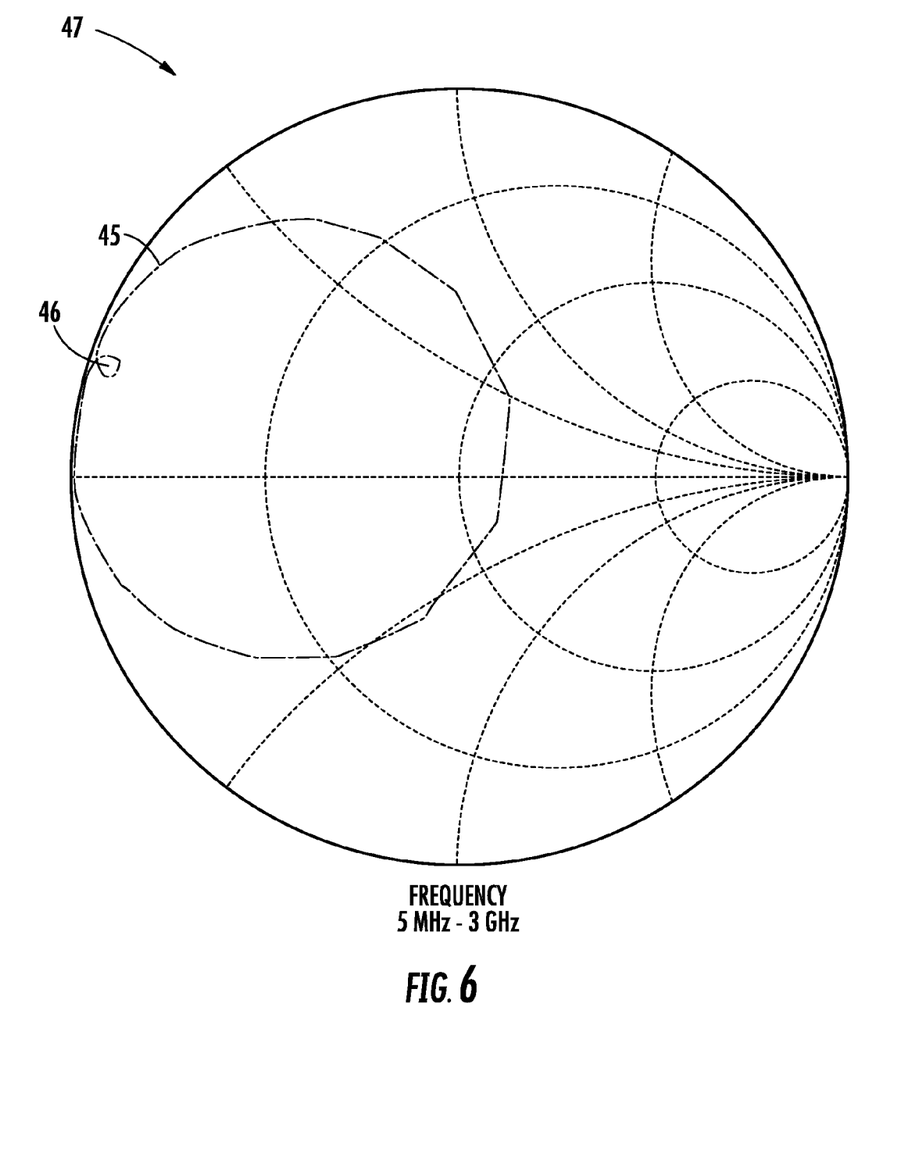
FIG. 6 is a graph of measured impedance of an electronic device in accordance with the present invention.
Figure 7:
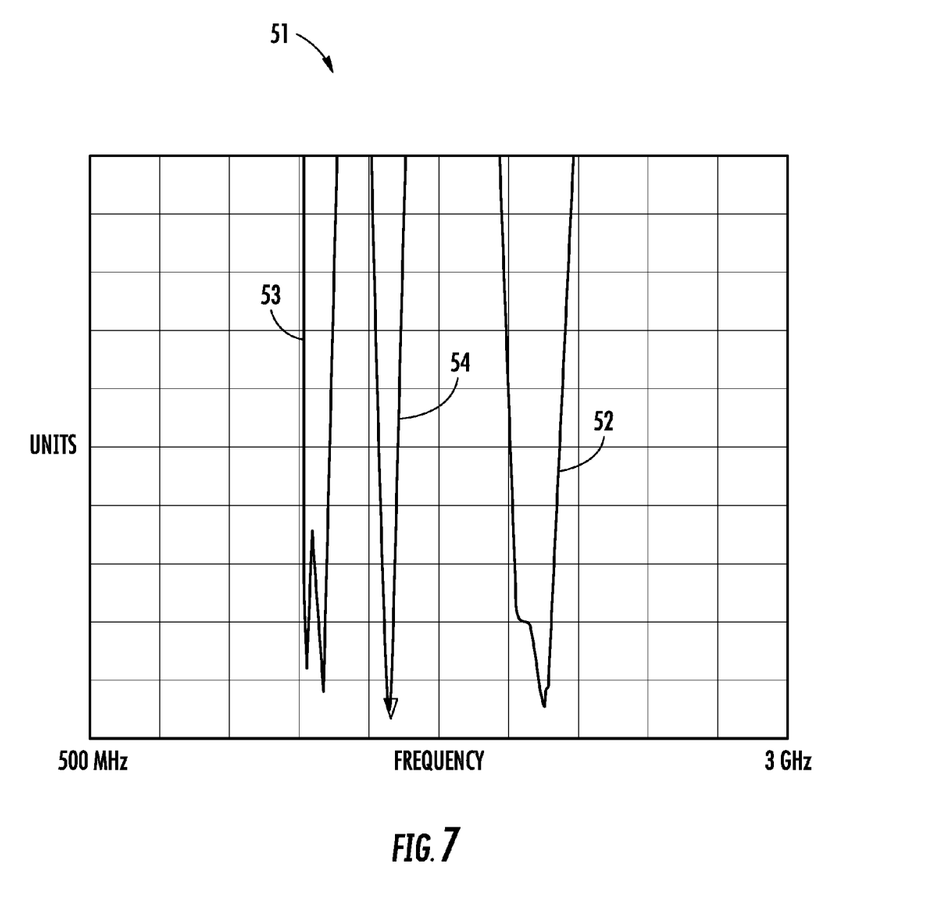
FIG. 7 is a graph of measured VSWR of the electronic device measured in FIG. 6.
Figure 8A:
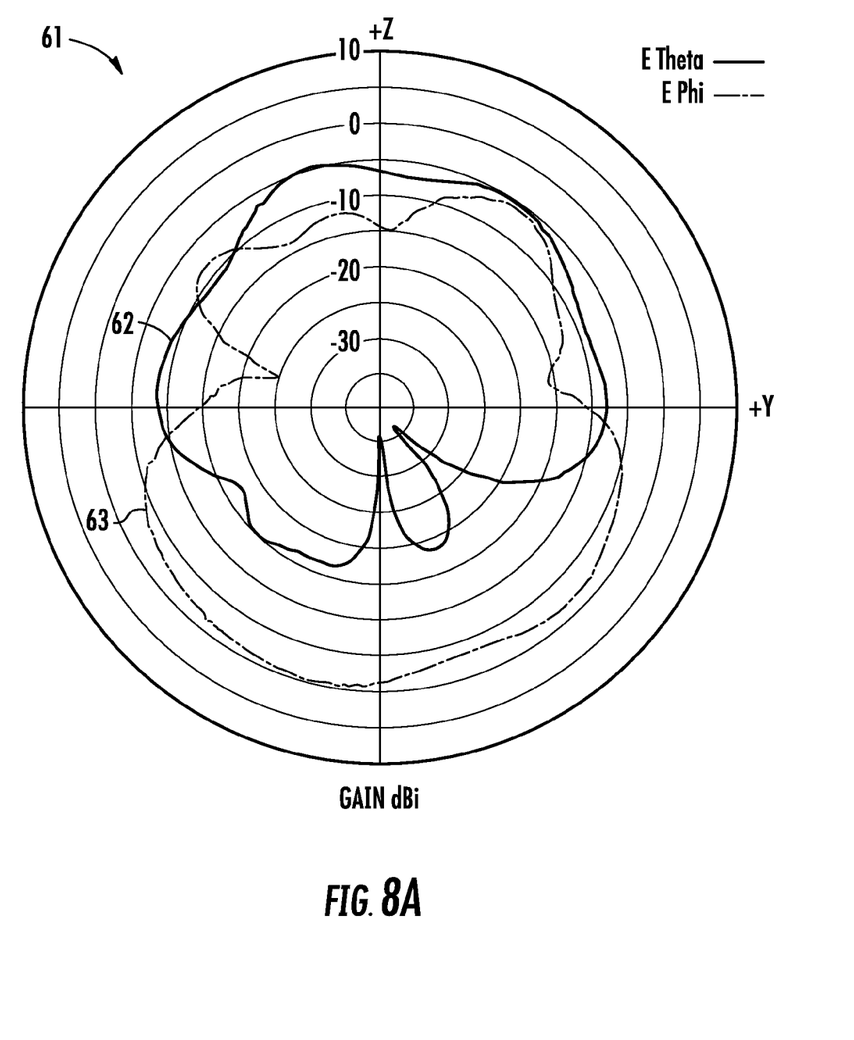
FIGS. 8a-8c are graphs of plane radiation patterns of the electronic device measured in FIG. 6.
Figure 8B:
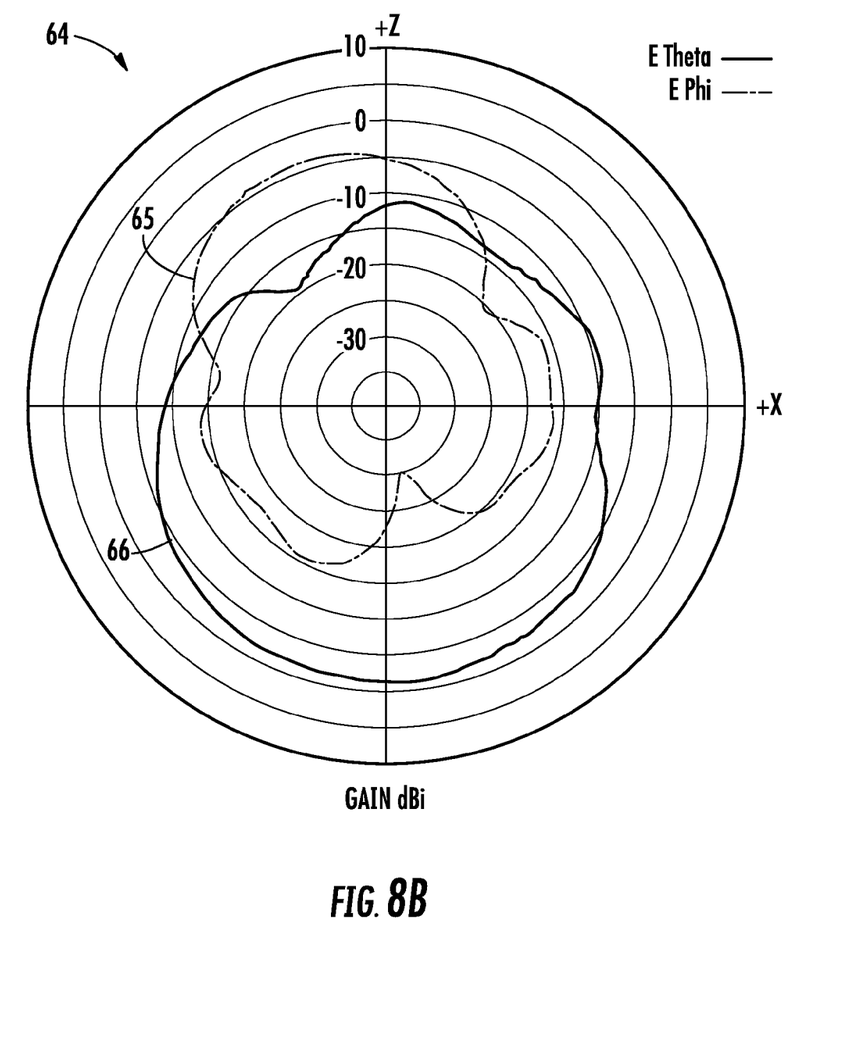
Figure 8C:
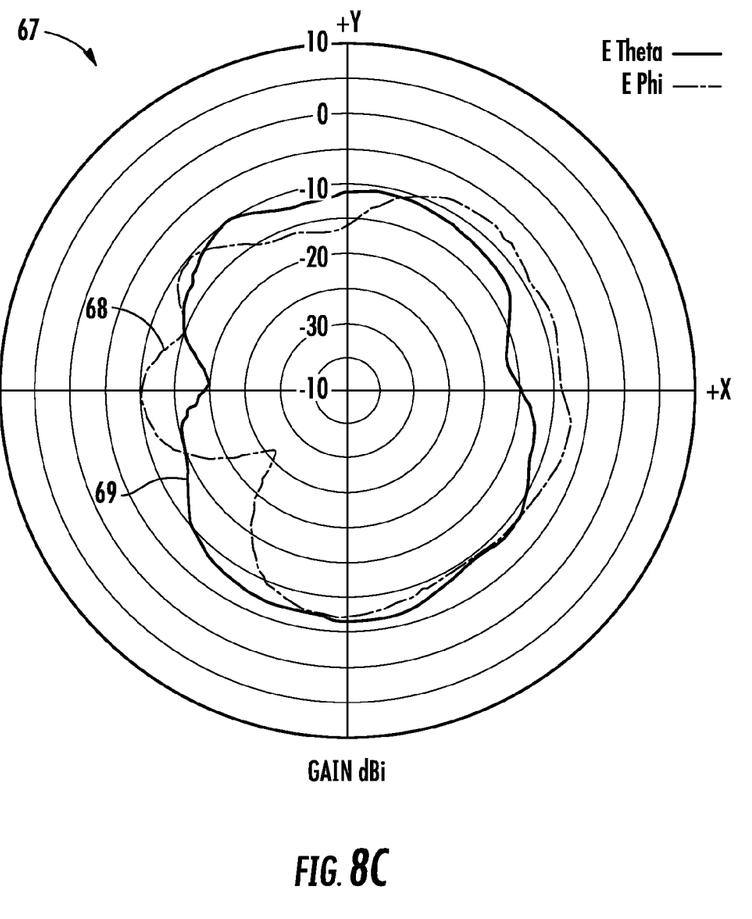

Referring now to the graphs in FIGS. 6-8, an antenna portion of the electronic device, similar to FIG. 1, including the solar cell, dielectric tuning body, shunt conductor, coaxial antenna feed line, and electric power conductor, was coupled to test equipment. The solar cell of the test was a conductively coated monocrystalline silicon cell, part number XOB17-12x1 as manufactured by IXYS Corporation of Milpitas, Calif. The solar cell has the dimensions of 22 millimeters (mm) in length by 7 mm in width by 1.6 mm in height. Without the tuning body, the solar cell's electrical dimensions corresponded to $0.11\lambda$ by $0.037\lambda$ by $0.0084\lambda$ where $\lambda$ is the 1575.2 MHz free space wavelength, so the phase length of the solar cell was about 39 degrees. The solar cell includes an electrically small antenna at 1575.2 MHz. The solar cell is a single bandgap type outputting about 630 millivolts DC open circuit in sunlight, as may be typical for a silicon device. The solar conversion efficiency was about 17%. The solar cell includes power terminals positioned on opposite ends of the solar cell, similar to the illustration of FIG. 1.

The tuning body had dimensions of 0.87 inches in length by 0.275 inches wide by 0.062 inches in height. The tuning body is formed of Arlon CER 10 (a CER-10 RF Laminate) available from Taconic, Inc. of Petersburgh, N.Y. As will be appreciated by those skilled in the art, the tuning body includes a relative permittivity of 10 farads per meter. Tuning is accomplished by sliding the tuning body. The solar cell overlapped the tuning body by 0.11 inches when the antenna was operated at 1575.2 MHz. No photosensitivity was noted, e.g. the antenna operating frequency did not shift between daylight and darkness light conditions.

Two legs corresponding to the L-shaped drive shunt conductor are each the same length and are each 0.025 inches. The L-shaped drive shunt conductor is coupled to the coaxial antenna feed line. A DC electrical power conductor extended across the solar cell from the positive power terminal. The DC electrical power conductor was a #30 AWG enameled DC power conductor. Copper foil was coupled to the aluminum ground plane to allow soldering to the ground plane. The aluminum ground plane was a 14-inch diameter circular ground plane. The radius of the ground plane is 0.93λ at 1.575 GHz, or at a GPS frequency.

The graph 47 of FIG. 6 illustrates the measured circuit impedance of the antenna (z=r+jx) at the coaxial feed connection in a Smith chart format. Illustratively, the single tuned quadratic frequency response 45 is centered on 1575 MHz, which corresponds to a global positioning system frequency, for example. At the 1575 Mhz resonance the impedance of the antenna was z=68+j0 Ohms or a 68 Ohm resistance. The graph also illustrates the DC power lead coupling 46. As will be appreciated by those skilled in the art, as the antenna frequency changes, the load impedance changes accordingly. Other combinations of resistance and reactance may be provided by adjustment. The graph 51 of FIG. 7 illustrates measured voltage standing wave ratio (VSWR) for the prototype antenna. A HP 8753C vector network analyzer was used to measure the VSWR. The graph 51 includes three plotted traces which illustrate the measured VSWR for different positions of the tuning body, for example, all the way in 53 (no extension past the solar cell), the solar cell overlapping the tuning body by 0.11 inches 54, and with no tuning body 52. At 1575 MHz, the 2 to 1 VSWR bandwidth was measured to be 23 MHz or 1.5%, and the 6 to 1 VSWR bandwidth was measured to be 89 MHz, or 5.7 percent. The 1575 MHz circuit Q may be derived from the universal resonance formula to be 200/5.7=36. The Q parameter is a dimensionless number. As will be appreciated by those skilled in the art, a 2 to 1 maximum VSWR may be preferred for transmitting, and a 6 to 1 maximum VSWR may be preferred for receiving. A 6 to 1 VSWR corresponds to a 3 dB mismatch loss, and thus, this may approximate the half power gain bandwidth. As illustrated, the antenna matches and tunes over a 2.3 to 1 frequency range, and advantageously includes a single control. Tuning was limited to the tuning body 25, and the affect of light on the tuning was not noticeable.

The graphs 61, 64, and 67 in FIGS. 8a-8c are typical far field radiation patterns for the antenna. More particularly, the graph 61 of FIG. 8a illustrates the gain pattern of the antenna in the YZ plane and more particularly, using phi 63 and theta 62 angles. The graph 64 in FIG. 8b illustrates the gain pattern of the antenna in the XZ plane using phi 65 and theta 66 angles. The graph 67 in FIG. 8c illustrates the gain pattern of the antenna in the XY plane using phi 68 and theta 69 angles. As illustrated, the realized gain is about −1 dBil, wherein a dBil unit corresponds to decibels with respect to an isotropic radiator and for linear polarization. As will be appreciated by those skilled in the art, realized gain is the gain at the peak pattern amplitude look angles, at the peak polarization, and the realized gain includes the directivity, mismatch losses if any, and material dissipative losses if any. The measurement was taken according to the principles of IEEE Standard 149 "IEEE Standard Test Procedures For Antennas" so this standard is identified herein for reference. The patterns were measured in an indoor anechoic chamber on a circular ground plane. Probing the antenna range showed that the chamber had a standing wave reflection levels of ±1.4 dB, and this may include the measurement uncertainty.

The electronic device 10 has also been tested and found effective in driving series array solar cells such as the IXYS Corporation model XOB17-04x3 3-element solar call array, which outputs 1.89 volts DC open circuit from three silicon bandgaps. The transparent conductive coating common to most solar cells conducts radio frequency electric currents so the electronic device 10 may be implemented with a variety of solar cells devices.

A theory of operation for the antenna function of the solar cell 11 will now be considered. Most solar cells are typically manufactured regardless of antenna characteristics. Accordingly, they may not be an appropriate size for natural resonance on the desired operating frequency or without electrical connections except at their ends. The electronic device 10 advantageously may force resonate the solar cell 11 on a desired operating frequency and to obtain a useful impedance match from the available connections. The example and prototype of the electronic device 10 used a solar cell 11 that was relatively electrically small, for example, and none of the dimensions were more than a ¼ wavelength in air at the operating frequency.

The electronic device 10 may also provide complex impedances (z=r+jx ohms) to the coaxial antenna feedline 15, but in typical practice the solar cell antenna 11 is adjusted to 52 Ohms resistance (z=52+j0 ohms). The resistance component r obtained from the solar cell antenna is controlled by adjusting the size of the drive shunt conductor 26. Increasing the aperture area enclosed by the drive shunt conductor 26 increases the resistance, and decreasing the aperture area of the drive shunt conductor reduces the resistance. The reactance x from the solar cell antenna is preferentially set to 0, for example, the antenna is operated at resonance. The resonance operating frequency is determined by the physical size of the solar cell 11, its height above the ground plane 14, and the size, material type and location of the tuning body 25. For elongated, high aspect solar cells, and for a relatively large tuning body 25 resonance frequency may be approximated by:

$$L = 0.23 \lambda_{air} (1/\sqrt{\mu_r \in_r})$$

Where:
L=the length of the solar cell
$\lambda_{air}$=the wavelength in free space=c/f
$\mu_r$=the relative permeability of the tuning body
$\in_r$=the relative permittivity of the tuning body
Thus, the electronic device 10 may be operated at ¼ wavelength fundamental resonance. When the tuning body 25 is nonmagnetic, nonconductive, and dielectric, for example, such as a Teflon™ tuning body, placing more of the tuning body under the solar cell 11 reduces the operating frequency, and placing less of the tuning body under the solar cell 11 raises the operating frequency. The single control tuning range may be about 3 to 1 or more, so it may not be desirable to change the dimensions of the drive shunt inductor 26 to adjust the frequency of the antenna once the initial match is obtained.

The radiation pattern of the solar cell antenna is a Fourier transform of the radio frequency electric currents that flow on the conductive structures. For analysis purposes, the different structural portions of the antenna may be considered separate antenna elements and array techniques used to sum the fields. Thus, as will be appreciated by those skilled in the art, the moment method may be employed where the linear members are treated like individual dipoles, and their radiated fields summed at the various look angles. The elements of the FIG. 1 electronic device 10 may then include the two vertically oriented linear members from the drive shunt conductor; the one horizontal member from the drive shunt conductor; and the solar cell. Vertically polarized radiation (E fields normal to the ground plane) may be contributed by the drive shunt conductor and horizontally polarized radiation (E fields parallel to the ground plane) by the solar cell. The current distribution on the example of the electronic device 10 was sinusoidal with the maximum amplitude occurring at the grounded end of the drive shunt conductor 26. The solar cell 11 generally may thus provide both broadside and in plane radiation.

The tuning body 25 may include properties of conductivity σ, permittivity ∈, and permeability µ. Using a good electrical conductor, e.g. brass for the tuning body may cause a lowering of operating frequency as the tuning body was inserted under the solar cell 11 and improved radiation efficiency was realized at 1575 MHz. A brass tuning body may emulate a variable capacitor plate, for example. Dielectric tuning bodies, such as Teflon™, for example, also may lower operating frequency with increased tuning body insertion with improved radiation efficiency, again at ultra high frequencies (UHF).

A nickel zinc ferrite material was tested for the tuning body 25, and it was fabricated by grinding a phenolic binder casting of ferrite mix 68 as vended by Fair-Rite Products Corporation of Wallkill, N.Y. The ferrite material had approximately equal relative permittivity and permeability ($\mu_r = \in_r = 13$), and it raised the frequency of the antenna in some placements and lowered the frequency in others. The equal permittivity characteristics of light nickel zinc ferrite may be advantageous for the tuning body 25 for increased instantaneous gain bandwidth because the material has the same characteristic impedance of free space or nearly so as $\eta = 120\pi\sqrt{\mu_r/\in_r} = 120\pi\sqrt{13/13} = 377$, which is the characteristic impedance of free space.

A method aspect includes increasing the size of the tuning body 25 to encompass the area around the solar cell 11 for an increased loading effect. The RF magnetic materials may include some bulk conductivity, about 0.5 to 10 milliohms/meter for ferrites so they are increasingly efficient at very high frequencies (VHF) and lower frequencies. Dielectric only materials may thus be preferred at UHF.

The instantaneous gain bandwidth of the electronic device 10 is largely a function of the height of the solar cell 11 above the ground plane 14. An approximation for the instantaneous 2 to 1 VSWR bandwidth of the solar cell 11 in MHz is B=150 $hf^2$, where h is the height of the bottom of the solar cell above the ground plane 14 in inches and f is the frequency in GHz.

The electronic device 10 may also include electronic tuning (not shown), which may provide broad tunable bandwidth of 1 or more octaves, as the pattern bandwidth of the solar cell antenna generally exceeds the impedance bandwidth. The electronic tuning may include a Varactor diode connected to the solar cell 11 through a DC blocking capacitor, or with a biasable media. A magnetic biasable media may include a magnetic tuning body, for example, a ferrite puck, with a quiescent (DC) magnetic field applied as a tuning bias by an external electromagnet, which saturates the ferrite pulling the tuning body permeability, in turn adjusting antenna frequency.

A method aspect includes a double tuning method. The double tuning method provides increased instantaneous gain bandwidth from planar antennas, such as the electronic device 10 by implementing a Chebyschev polynomial frequency response. At radio frequency (RF), the electrical power conductor 27 doubles back over the solar cell 11 forming an electrically folded circuit. A virtual ground exists at the apex of the fold to permit the DC to be withdrawn with reduced impacting on the RF operation of the antenna.

The double tuning method includes adjusting the length of the electrical power conductor 27 to cause the double tuning Chebyschev polynomial response. The resonant frequency of the transmission line stub formed by the combination of the solar cell 11 and the electrical power conductor 27 may then be different from that of the solar cell so the there are two resonances. The solar cell 11 and the electrical power conductor 27 may be viewed as two antennas in parallel. The realized two-pole Chebyschev response antenna has about four times the instantaneous gain bandwidth of a single tuned quadratic frequency response antenna. The result of the double tuning method measured on a prototype is seen in the double dip frequency response seen in the plotted trace 53 of FIG. 7. It is noted that FIG. 7 includes three plotted traces on the same graph taken at different times for different frequencies obtained by adjustments of the tuning body 25. A common and a differential mode of current flow exists in the double tuned antenna so that the electrical power conductor is a transmission line stub resonant circuit, and a transducer of RF currents into radio waves.

Multiple electrical power conductors (not shown) may be included for additional frequency response and multiple frequency band capability. It may be advantageous that the wires, PWB traces, etc. that form the drive shunt conductor 26 not be configured within about 2.7 to 3.0 conductor diameters of each other. This may reduce the conductor skin effect, which increases resistive losses, joule effect losses, and unwanted heating. This may be similar to the practice of spacing conductors in helical, solenoidal wire inductors, as will be appreciated by those skilled in the art.

A method aspect is directed to a method of making an electronic device. The method includes spacing the solar cell 10 above the ground plane. The method also includes coupling an inner conductor 16 of a coaxial antenna feed line 15 to a first power output terminal 12 and coupling an outer conductor 17 of the coaxial antenna feed line to the ground plane 14 so that the solar cell 11 also serves as a patch antenna element. The method also includes coupling a drive shunt conductor 26 to extend between the first power output terminal 12 and the ground plane 14.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. An electronic device comprising:
   a ground plane;
   a solar cell spaced above said ground plane and having first and second power output terminals;
   a coaxial antenna feed line comprising an inner conductor coupled to the first power output terminal, and an outer conductor coupled to said ground plane so that said solar cell also serves as a patch antenna element; and
   a drive shunt conductor extending between the first power output terminal and said ground plane.

2. The electronic device according to claim 1, further comprising an antenna tuning body between said ground plane and said solar cell.

3. The electronic device according to claim 2, wherein said antenna tuning body comprises a dielectric material.

4. The electronic device according to claim 1, further comprising a plurality of antenna tuning bodies between said ground plane and said solar cell.

5. The electronic device according to claim 1, wherein said drive shunt conductor is coupled to said ground plane adjacent said coaxial antenna feed line.

6. The electronic device according to claim 1, further comprising an electrical power conductor coupled to the second power output terminal.

7. The electronic device according to claim 6, wherein said ground plane has an opening therein adjacent said drive shunt conductor; and wherein said electrical power conductor passes through the opening.

8. The electronic device according to claim 1, wherein said solar cell is spaced above said ground plane by less than 0.1 times a wavelength of a desired operating frequency of the patch antenna element.

9. The electronic device according to claim 1, further comprising circuitry powered by said solar cell.

10. An electronic device comprising:
a ground plane;
a solar cell spaced above said ground plane and having first and second power output terminals;
a coaxial antenna feed line comprising an inner conductor coupled to the first power output terminal, and an outer conductor coupled to said ground plane so that said solar cell also serves as a patch antenna element;
a drive shunt conductor extending between the first power output terminal and said ground plane;
an antenna tuning body positioned between said ground plane and said solar cell; and
circuitry powered by said solar cell.

11. The electronic device according to claim 10, wherein said circuitry comprises at least one of a receiver and a transmitter.

12. The electronic device according to claim 10, wherein said antenna tuning body comprises a dielectric material.

13. The electronic device according to claim 10, wherein said drive shunt conductor is coupled to said ground plane adjacent said coaxial antenna feed line.

14. The electronic device according to claim 10, further comprising an electrical power conductor coupled to the second power output terminal.

15. A method of making an electronic device comprising:
spacing a solar cell above a ground plane;
coupling an inner conductor of a coaxial antenna feed line to a first power output terminal of the solar cell;
coupling an outer conductor of the coaxial antenna feed line to the ground plane so that the solar cell also serves as a patch antenna element; and
coupling a drive shunt conductor to extend between the first power output terminal and the ground plane.

16. The method according to claim 15, further comprising coupling an antenna tuning body between the ground plane and the solar cell.

17. The method according to claim 16, wherein coupling the antenna tuning body comprises coupling a dielectric material antenna tuning body.

18. The method according to claim 15, wherein coupling the drive shunt conductor comprises coupling the drive shunt conductor to the ground plane adjacent the coaxial antenna feed line.

19. The method according to claim 15, further comprising coupling an electrical power conductor to a second power output terminal of the solar cell.

20. The method according to claim 15, wherein spacing the solar cell comprises spacing the solar cell above the ground plane by less than 0.1 times a wavelength of a desired operating frequency of the patch antenna element.

* * * * *